(12) United States Patent
Too et al.

(10) Patent No.: US 7,256,067 B1
(45) Date of Patent: Aug. 14, 2007

(54) LGA FIXTURE FOR INDIUM ASSEMBLY PROCESS

(75) Inventors: Seah Sun Too, San Jose, CA (US); Tek Seng Tan, Panang (MY); Keng Sang Cha, Penang (MY); Kee Hean Keok, Perak (MY)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 11/381,089

(22) Filed: May 1, 2006

(51) Int. Cl.
*H01L 21/00* (2006.01)

(52) U.S. Cl. ............... 438/106; 438/108; 438/455; 438/117; 438/122; 257/704; 257/710; 257/E23.18; 257/E21.5

(58) Field of Classification Search ............... 438/66, 438/110, 106–108, 455, 943, FOR. 365, 438/FOR. 369
See application file for complete search history.

(56) References Cited

U.S. PATENT DOCUMENTS

| | | |
|---|---|---|
| 6,748,350 B2 | 6/2004 | Rumer et al. |
| 6,812,548 B2 * | 11/2004 | Dias et al. ............... 257/620 |
| 6,848,172 B2 | 2/2005 | Fitzgerald et al. |
| 6,848,610 B2 | 2/2005 | Liu |
| 6,867,978 B2 | 3/2005 | Whittenburg et al. |
| 6,870,258 B1 | 3/2005 | Too |
| 6,882,535 B2 | 4/2005 | Labanok et al. |
| 6,924,170 B2 | 8/2005 | Ravi et al. |
| 6,934,154 B2 | 8/2005 | Prasher et al. |
| 6,936,501 B1 | 8/2005 | Too et al. |
| 6,987,317 B2 | 1/2006 | Pike |
| 6,989,586 B2 | 1/2006 | Agraharam et al. |
| 7,009,289 B2 | 3/2006 | Hu et al. |
| 7,012,011 B2 | 3/2006 | Chrysler et al. |
| 7,014,093 B2 | 3/2006 | Houle et al. |
| 7,015,073 B2 | 3/2006 | Houle et al. |

* cited by examiner

*Primary Examiner*—Jasmine Clark
(74) *Attorney, Agent, or Firm*—Timothy M. Honeycutt

(57) ABSTRACT

An integrated circuit lid fixture and methods of using the same are provided. In one aspect, an integrated circuit lid fixture is provided that includes a base that has a plurality of pillars. Each of the plurality of pillars has a surface for supporting a substrate that may be removably seated thereon. The surfaces of the plurality of pillars have a first footprint at least as large as a footprint of the substrates to be placed thereon. A plate is provided for applying a compressive force to an integrated circuit lid positioned on any of the substrates removably seated on the pillars.

18 Claims, 3 Drawing Sheets

LGA FIXTURE FOR INDIUM ASSEMBLY PROCESS

BACKGROUND OF THE INVENTION

1. Field of the Invention

This invention relates generally to semiconductor processing, and more particularly to apparatus and methods for attaching lids to integrated circuit substrates.

2. Description of the Related Art

Many current integrated circuits are formed as multiple die on a common wafer. After the basic process steps to form the circuits on the die are complete, the individual die are cut from the wafer. The cut die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder bumps are provided between the bond pads of the die and substrate interconnects to establish ohmic contact. After the die is mounted to the substrate, a lid is attached to the substrate to cover the die. Some conventional integrated circuits, such as microprocessors, generate sizeable quantities of heat that must be ferried away to avoid device shutdown or damage. The lid serves as both a protective cover and a heat transfer pathway.

To provide a heat transfer pathway from the integrated circuit to the lid, a thermal interface material is placed on the upper surface of the integrated circuit. In an ideal situation, the thermal interface material ideally fully contacts both the upper surface of the integrated circuit and the portion of the lower surface of the lid that overlies the integrated circuit. Conventional thermal interface materials include various types of pastes, and in some cases, a metal. More recently, designers have begun to turn to indium as a thermal interface material.

The attachment of a lid to a die substrate involves a complex choreography of steps. The thermal interface material must be applied to the die. An adhesive must be applied to the substrate and cured in such a way that does not produce unwanted irregularities in the thickness or wetting of the thermal interface material. The lid must be attached to the substrate so that the tilt of the lid relative to the die is within acceptable tolerances. High tilt can lead to nonuniformities in thermal interface material thickness, which can produce poor heat transfer characteristics. A major factor in achieving acceptable lid tilt is the use of a proper fixture to hold the die substrates during lid processing.

One conventional fixture suitable for use with a pin grid array (PGA) die substrate uses a flat bottom plate upon which the PGA substrates are seated. After the lids are placed on the substrates, a middle plate is pressed down on the lids and the substrates are subjected to various thermal cycles to cure the adhesive. Depending on the composition and stiffness of the bottom plate, the thermal cycles can produce a warping of the bottom plate. Warping of the bottom plate can lead to misalignment of the lids and attendant tilt errors. This conventional fixture is not suitable for a class of die substrates known as land grid array (LGA) substrates. LGA substrates dispense with the downwardly projecting pins used in PGA substrates.

The present invention is directed to overcoming or reducing the effects of one or more of the foregoing disadvantages.

SUMMARY OF THE INVENTION

In accordance with one aspect of the present invention, an integrated circuit lid fixture is provided that includes a base that has a plurality of pillars. Each of the plurality of pillars has a surface for supporting a substrate that may be removably seated thereon. The surfaces of the plurality of pillars have a first footprint at least as large as a footprint of the substrates to be placed thereon. A plate is provided for applying a compressive force to an integrated circuit lid positioned on any of the substrates removably seated on the pillars.

In accordance with another aspect of the present invention, a method of attaching a lid to a substrate is provided that includes providing a base that has a plurality of pillars. Each of the plurality of pillars has a surface for supporting a substrate that may be removably seated thereon. The surfaces have a first footprint at least as large as a footprint of the substrate. The substrate is placed on one of the plurality of pillars. The substrate has an integrated circuit positioned thereon. The lid is attached to the substrate.

In accordance with another aspect of the present invention, a method of attaching a lid to a substrate is provided. A base is provided that has a plurality of pillars. Each of the plurality of pillars has a surface for supporting a substrate that may be removably seated thereon. The surfaces have a first footprint at least as large as a footprint of the substrate. The substrate is placed on one of the plurality of pillars. The substrate has an integrated circuit positioned thereon. An indium film is positioned on the integrated circuit. The lid is attached to the substrate. The indium is wetted to both the integrated circuit and the lid by reflowing.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
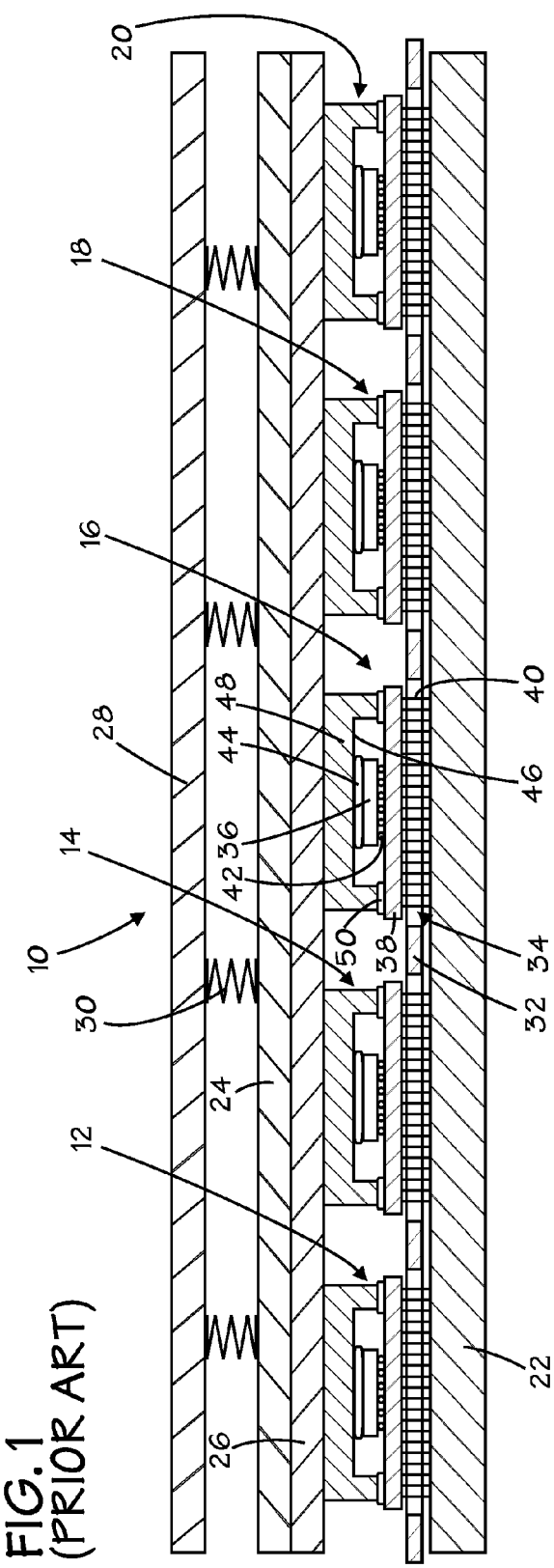
FIG. 1 is a cross-sectional view of an exemplary conventional fixture suitable for holding a plurality of integrated circuit packages during lid attachment processing.

In the drawings described below, reference numerals are generally repeated where identical elements appear in more than one figure. Before describing exemplary embodiments in accordance with the present invention, it will be instructive to briefly review some particulars of a conventional structure. Turning now to the drawings, and in particular to FIG. 1, therein is shown a cross-sectional view of an exemplary conventional fixture 10 suitable for holding a plurality of integrated circuit packages 12, 14, 16, 18 and 20 during lid attachment processing. The fixture 10 includes a base plate 22 upon which the circuit packages 12, 14, 16, 18 and 20 are seated. A middle plate 24 is designed to seat on top of the circuit packages 12, 14, 16, 18 and 20. The middle plate 24 is provided with a compliant sheet 26 composed of rubber or other compliant material. The middle plate 24 is brought into secure engagement with the upper surfaces of the circuit packages 12, 14, 16, 18 and 20 by way of a top plate 28 that includes a plurality of springs 30. Pressure is applied downward on the top plate 28 by an automated machine or manual clamps and results in a downward force transmitted through the middle plate to the circuit packages 12, 14, 16, 18 and 20.

The assembly of the circuit packages 12, 14, 16, 18 and 20 involves a number of process steps that are routinely carried out in different locations. Accordingly, a rack or boat 32 is utilized to hold the circuit packages 12, 14, 16, 18 and 20 during movement between various processing areas. As better seen in FIG. 2, which is a pictorial view, the boat 32 includes a plurality of openings 34 and two upwardly-projecting posts 35 at each of the corners of the openings 34. The function of the posts 35 will be described in more detail below. As described in more detail below, the openings 34 are designed to accommodate at least a portion of circuit packages 12, 14, 16, 18 and 20.

Figure 2:
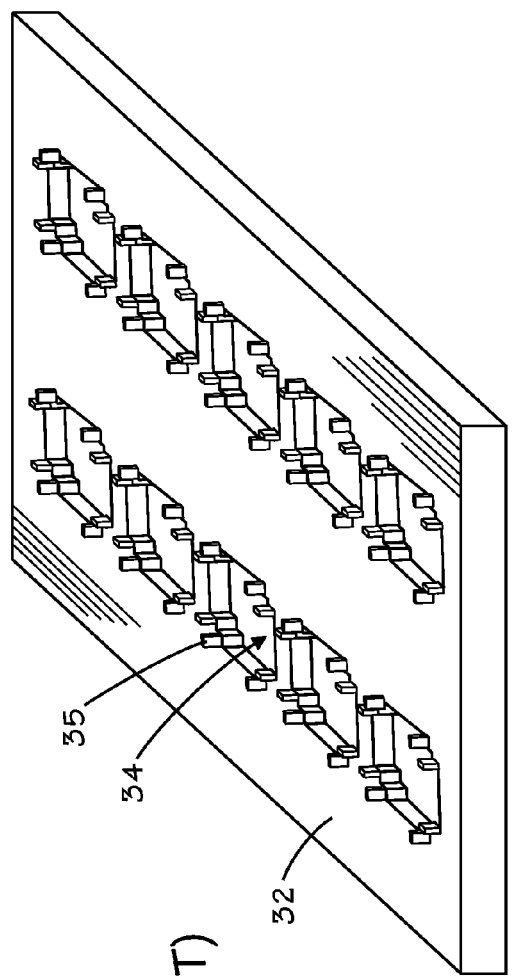
FIG. 2 is a pictorial view of a conventional rack for holding integrated circuit packages during various stages of processing.

Referring still to FIG. 1, the structure of the circuit package 16 will now be described. The following description will be illustrative of the other circuit packages 12, 14, 18 and 20. The circuit package 16 includes an integrated circuit 36 that is flip-chip mounted to a pin grid array (PGA) substrate 38. The aforementioned posts 35 of the boat 32 depicted in FIG. 2 are designed to constrain the corners of the substrate 38 and thereby keep the substrate 38 is the proper position. The PGA substrate 38 includes a plurality of downwardly-projecting conductor pins 40. Solder bumps 42 are formed on a surface of the integrated circuit 36 and bonded to bond pads (not shown) positioned on the upper surface of the substrate 38. After bonding, an underfill material (not shown) is dispensed between the integrated circuit 36 and the upper surface of the substrate 38. A thermal interface material 44 is disposed between an upper surface of the integrated circuit 36 and a lower surface 46 of a package lid 48. During assembly, an adhesive film 50 is placed on the upper surface of the substrate 38 and the package lid 48 is brought down into contact with the adhesive film 50. The fixture 10 is designed to bring the package lid 48 into secure contact with the adhesive film 50 during a curing process.

As noted above, the plurality of openings 34 in the boat 32 are designed to accommodate portions of the circuit packages 12, 14, 16, 18 and 20. In this regard, the openings 34 are designed to permit the plurality of conductor pins 40 for each of the circuit packages 12, 14, 16, 18 and 20 to project downwardly therethrough and seat on the bottom plate 22. When the boat 32 is lowered into position, the conductor pins 40 engage the plate 22 and the boat 32 drops to the point where it no longer supports the weight of the circuit packages 12, 14, 16, 18 and 20. The fixture 10 depicted in FIGS. 1 and 2 is suitable for handling PGA type substrates. However, it is relatively unsuitable for handling land grid array (LGA) types of substrates.

An exemplary embodiment of a fixture 52 in accordance with the present invention may be understood by referring now to FIG. 2, which is a cross-sectional view. The fixture 52 is suitable for handling LGA circuit packages 54, 56, 58, 60 and 62. Like the conventional fixture 10 depicted in FIGS. 1 and 2, the fixture 52 includes a middle plate 24, a compliant sheet 26, a top plate 28 and a plurality of springs 30. Again, the boat 32 is used to hold the circuit packages 54, 56, 58, 60 and 62.

The following description of the structure and function of the LGA package 58 will be illustrative of the other LGA packages 54, 56, 60 and 62. The LGA package 58 includes an LGA substrate 64 upon which an integrated circuit 66 is flip-chip mounted and interconnected electrically to the substrate 64 by way of solder bumps 68. The LGA substrate 64 has a relatively flat lower surface, that is, unencumbered by pins or like protrusions. The solder bumps 68 are electrically interconnected to bond pads (not shown) or other interconnect structures on the substrate 64. An underfill material (not shown) is disposed in and around the plurality of solder bumps 68. It should be appreciated that die mountings other than solder bump may be handled with the fixture 52.

A package lid 70 is secured to the substrate 64 by an adhesive film 72 and covers the integrated circuit 66. The lid 70 may be composed of ceramics or metallic materials. In an exemplary embodiment, the lid 70 is composed of nickel-coated copper. A thermal interface material 74 is disposed between the integrated circuit 66 and a lower surface 76 of the lid 70. The thermal interface material 74 is preferably composed of indium. However, other suitable thermal interface materials, such as, for example, gallium, various well-known thermal pastes, or thermal interface polymer materials may be used.

To facilitate the wetting of the indium 74 to the integrated circuit 66, the upper surface, i.e., the backside, of the integrated circuit 66 is provided with a metallization stack (not visible) that consists of an aluminum film formed on the integrated circuit, a titanium film formed on the aluminum film, a nickel-vanadium film formed on the titanium film and a gold film formed on the nickel-vanadium film. The aluminum film provides advantage adhesion with silicon. The titanium film provides a barrier layer to prevent gold from migrating into the integrated circuit, the nickel-vanadium film provides desirable adhesion between with gold and the gold film provides a desirable wetting surface for indium. Indeed, a gold film may be provided on the lower surface 76 of the lid 70. The selection appropriate materials for the backside metallization will depend on the composition of the integrated circuit 66 and the thermal interface material 74.

Figure 4:
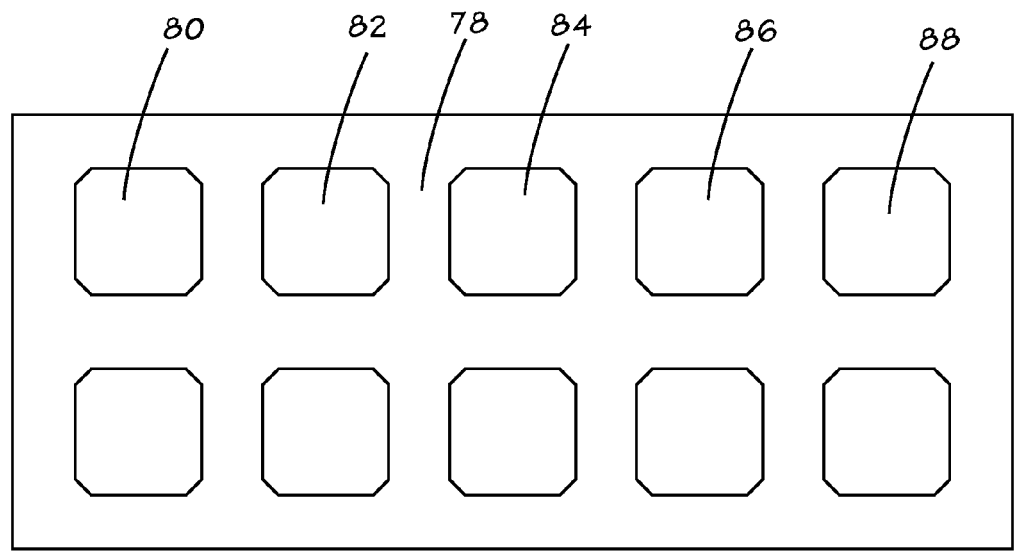
FIG. 4 is a plan view of an exemplary embodiment of a base component of the fixture depicted in FIG. 3 in accordance with the present invention.

A base plate 78 is provided to support the circuit packages 54, 56, 58, 60 and 62. The base plate 78 may but need not have a flat lower surface 79. Unlike the base plate 22 in the conventional fixture 10 depicted in FIG. 1, the top of the base plate 78 is not a uniplanar structure. Instead, the base plate 78 includes a plurality of pillars or pedestals 80, 82, 84, 86 and 88 which respectively support the LGA packages 54, 56, 58, 60 and 62. A plan view of the base plate 78 is depicted in FIG. 4. Note that the pedestals 80, 82, 84, 86 and 88 as well as five others that are not numbered for a total of ten are depicted in FIG. 4. However, it should be understood that the number of pedestals is largely a matter of design discretion. The pillars 80, 82, 84, 86 and 88 are advantageously provided with a footprint that generally corresponds to the footprint of the LGA substrates 64 so that when the boat 32 is lowered, the packages 54, 56, 58, 60 and 62 will land and seat on the pedestals 80, 82, 84, 86 and 88 but the boat 32 will drop over the pedestals 80, 82, 84, 86 and 88 and move downward vertically so that the respective LGA substrates 64 of the packages 54, 56, 58, 60 and 62 seat on the pedestals 80, 82, 84, 86 and 88. It is desirable for the pillars 80, 82, 84, 86 and 88 to have a footprint, that is, an upper surface size and geometry, that is at least as large as the LGA substrates 64 of the LGA packages 54, 56, 58, 60 and 62. In this way, the supporting force supplied to the substrates 64 by the pillars 80, 82, 84, 86 and 88 will be relatively uniform and thus produce very little if any warping of the substrates 64. While an octagonal footprint is depicted, other geometries are possible depending on the shape of the substrates 64.

After the packages 54, 56, 58, 60 and 62 are positioned on the pedestals 80, 82, 84, 86 and 88 and the middle and upper plates 24 and 28 are brought downward and into position, the packages 54, 56, 58, 60 and 62 may undergo whatever processing is appropriate at that time, such as, for example, a thermal cycle to cure the adhesive 72 or reflow the thermal interface material 74. Following the processing, the boat 32 may be lifted off the base plate 78 to move the circuit packages 54, 56, 58, 60 and 62 to another location.

It is desirable for the lids 70 to exhibit as little tilt relative to their underlying LGA substrates 64 as possible. High tilt may lead to undesirable migration of the thermal interface material 74 during various heating cycles and power cycles of the integrated circuits 66. Poor uniformity of thermal interface material may lead to higher than desired thermal resistance. Accordingly, the base plate 78 is advantageously composed of a material that can be formed with very flat 80, 82, 84, 86 and 88 pedestals, and that exhibits relatively high hardness. A plate 78 with a relatively high hardness will tend to resist warping during the various thermal cycles associated with assembling the packages 54, 56, 58, 60 and 62. In an exemplary embodiment, a tool steel hardened to a Rockwell hardness of about 56 to 58 and provided with a flatness variation of ∓T30 microns may be used. One example of such a material is a 440C stainless steel.

Figure 3:
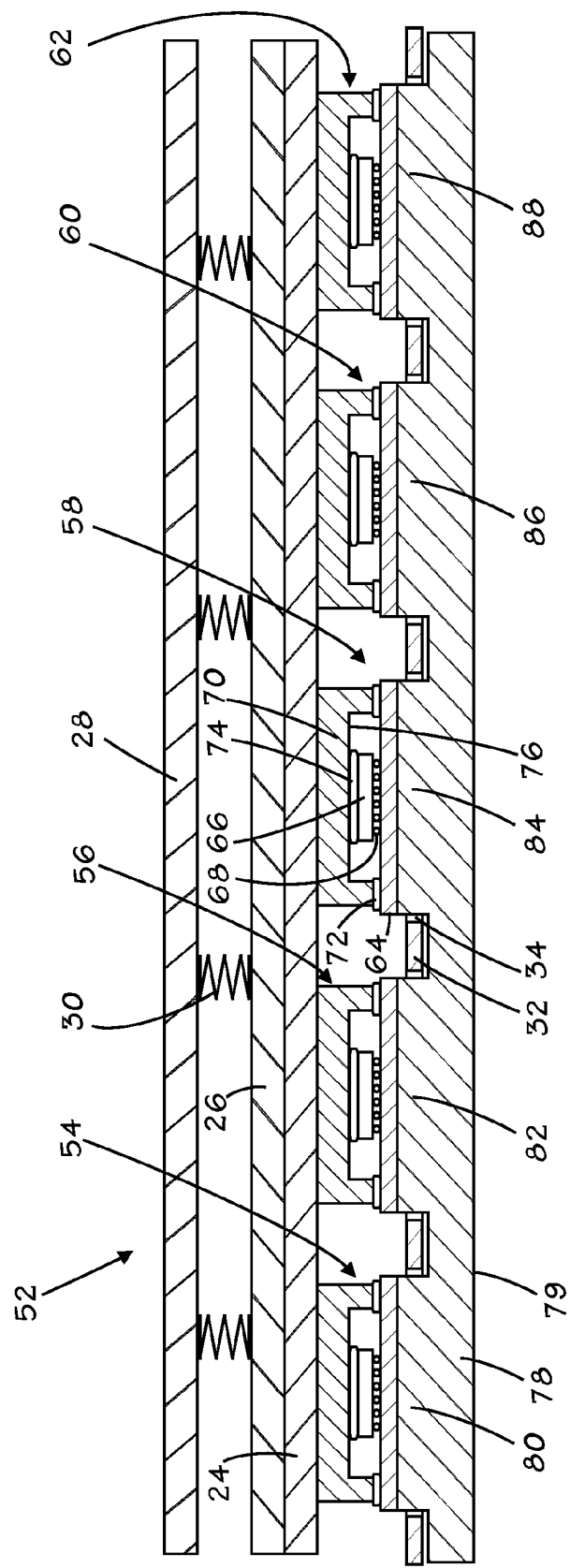
FIG. 3 is a cross-sectional view of an exemplary embodiment of a fixture suitable for holding a plurality of integrated circuit packages during lid attachment processing in accordance with the present invention.
Figure 5:
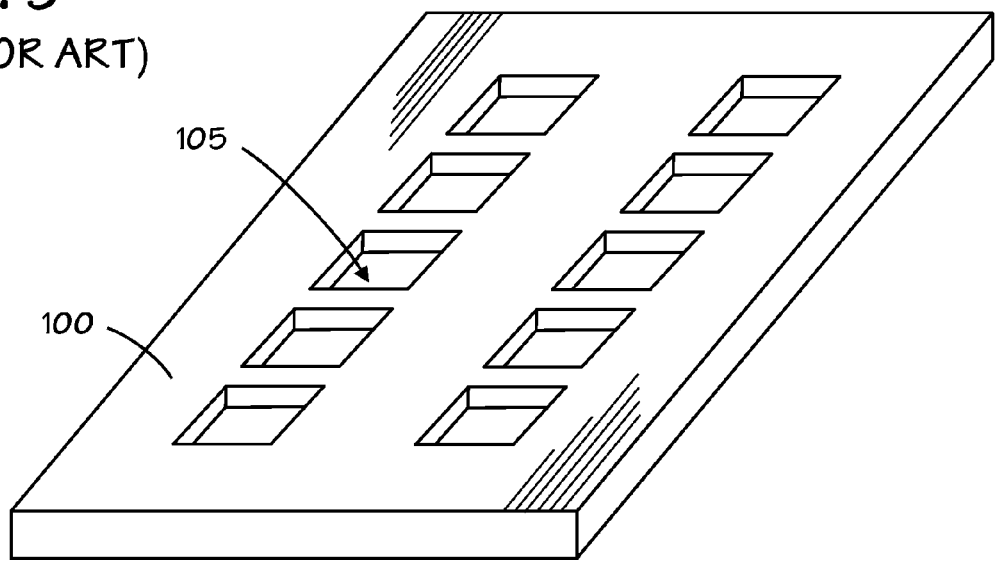
FIG. 5 is a pictorial view of an exemplary integrated circuit package lid plate to aid placement of a lid on one or more of the exemplary integrated circuit packages of FIG. 3 in accordance with the present invention.

One particular process step that may be performed with the aid of the fixture 52 is a lid attach process with an indium reflow. Again using the LGA package 56 as an example of all the packages 54, 56, 58, 60 and 62, the package 56 is placed on the pedestal 82, and a flux is applied to the upper surface of the integrated circuit 66 by, for example, a jet spray. The thermal interface material 74 is placed on the integrated circuit 66 and a coat of flux is applied to the thermal interface material 74. The adhesive 72 is then applied to the substrate 64 and the lid 70 seated on the adhesive, and clamping pressure is applied to the middle plate 24. The lid 70 may be preheated just prior to seating on the adhesive 72. An optional lid alignment plate 200, depicted in FIG. 5, may be used to facilitate placement of the lid 70 on the substrate 64 of the package 56. With the lid plate 100 temporarily placed over the package 56 and the base plate 78, the lid 70 is dropped in one of the openings 105 of the lid plate 100 and seated on the substrate 64. The lid plate 100 may be removed prior to positioning of the middle and top plates 26 and 28 depicted in FIG. 3.

An adhesive precure may be performed to provide a partial hardening of the adhesive 72. A partially hardened adhesive may provide better control of the thermal interface bond line thickness, that is, the thickness of thermal interface material 74. Suitable temperatures and times for the precure will depend on the adhesive and the thermal interface material. Fast curing adhesives may require as little as about 2.0 minutes at 100° C., however, a precure time of up to an hour will be more typical.

Following the adhesive precure, a reflow heating process may be performed to reflow the thermal interface material 74. The goal of the reflow is to fully wet the indium 74 to both the integrate circuit 66 and the lower surface 76 of the lid 70. Reflow will be desirable for a thermal interface material 74 like indium. In exemplary process for indium, the fixture 52 may be placed in a belt furnace with a nitrogen purge, clamping pressure off, and heated to about 170 to 190° C. for about 3.0 to 10.0 minutes. Following the reflow, a final cure of the adhesive 72 may be performed by heating the fixture 52 in an oven without clamping at about 125° C. for about 1.5 hours. Again the temperature and time will depend on the adhesive used. One example is silicone-based thixotropic adhesive, which provides a compliant bond.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of attaching a lid to a substrate, comprising:
providing a base having a plurality of pillars, each of the plurality of pillars having a surface for supporting a substrate removably seated thereon, the surface having a first footprint at least as large as a footprint of the substrate;
placing the substrate on one of the plurality of pillars, the substrate having an integrated circuit positioned thereon; and
attaching the lid to the substrate.

2. The method of claim 1, wherein the attaching of the lid comprises applying an adhesive to the substrate and putting the lid in contact with the adhesive.

3. The method of claim 2, comprising heating the lid before putting the lid in contact with the adhesive.

4. The method of claim 1, comprising placing a thermal interface material on the integrated circuit prior to attaching the lid.

5. The method of claim 4, wherein the thermal interface material comprises indium.

6. The method of claim 5, comprising reflowing the indium by heating after attaching the lid.

7. The method of claim 6, comprising precuring the adhesive prior to reflowing the indium.

8. The method of claim 7, comprising curing the adhesive after reflowing the indium.

9. A method of attaching a lid to a substrate, comprising:
providing a base having a plurality of pillars, each of the plurality of pillars having a surface for supporting a substrate removably seated thereon, the surface having a first footprint at least as large as a footprint of the substrate;
placing the substrate on one of the plurality of pillars, the substrate having an integrated circuit positioned thereon;
positioning an indium film on the integrated circuit;
attaching the lid to the substrate; and
wetting the indium to both the integrated circuit and the lid by reflowing.

10. The method of claim 9, wherein the attaching of the lid comprises applying an adhesive to the substrate and putting the lid in contact with the adhesive.

11. The method of claim 10, comprising heating the lid before putting the lid in contact with the adhesive.

12. The method of claim 11, comprising precuring the adhesive prior to reflowing the indium.

13. The method of claim 12, comprising curing the adhesive after reflowing the indium.

14. A method of attaching a lid to a substrate, comprising:
providing a base having a plurality of pillars, each of the plurality of pillars having a surface for supporting a substrate removably seated thereon, the surface having a first footprint at least as large as a footprint of the substrate;
placing the substrate on one of the plurality of pillars, the substrate having a microprocessor positioned thereon;
positioning an indium film on the integrated circuit;
attaching a nickel coated copper lid to the substrate; and
wetting the indium to both the microprocessor and the lid by reflowing.

15. The method of claim 14, wherein the attaching of the lid comprises applying an adhesive to the substrate and putting the lid in contact with the adhesive.

16. The method of claim 15, comprising heating the lid before putting the lid in contact with the adhesive.

17. The method of claim 16, comprising precuring the adhesive prior to reflowing the indium.

18. The method of claim 17, comprising curing the adhesive after reflowing the indium.

* * * * *